United States Patent
Fitzpatrick et al.

(10) Patent No.: US 9,329,928 B2
(45) Date of Patent: May 3, 2016

(54) BANDWIDTH OPTIMIZATION IN A NON-VOLATILE MEMORY SYSTEM

(71) Applicant: SanDisk Enterprise IP LLC, Dallas, TX (US)

(72) Inventors: James Fitzpatrick, Sudbury, MA (US); Amirhossein Rafati, Somerville, MA (US)

(73) Assignee: SANDISK ENTERPRISE IP LLC., Milpitas, CA (US)

( * ) Notice: Subject to any disclaimer, the term of this patent is extended or adjusted under 35 U.S.C. 154(b) by 61 days.

(21) Appl. No.: 14/076,148

(22) Filed: Nov. 8, 2013

(65) Prior Publication Data

US 2014/0237318 A1      Aug. 21, 2014

Related U.S. Application Data

(60) Provisional application No. 61/767,236, filed on Feb. 20, 2013.

(51) Int. Cl.
   H03M 13/00   (2006.01)
   G06F 11/10   (2006.01)
   H03M 13/11   (2006.01)

(52) U.S. Cl.
   CPC ............ *G06F 11/10* (2013.01); *G06F 11/1012* (2013.01); *H03M 13/1102* (2013.01)

(58) Field of Classification Search
   None
   See application file for complete search history.

(56) References Cited

U.S. PATENT DOCUMENTS

| | | |
|---|---|---|
| 4,048,481 A | 9/1977 | Bailey, Jr. et al. |
| 4,839,587 A | 6/1989 | Flatley et al. |
| 4,916,652 A | 4/1990 | Schwarz et al. |
| 5,034,744 A | 7/1991 | Obinata |
| 5,210,854 A | 5/1993 | Beaverton et al. |
| 5,311,395 A | 5/1994 | McGaha et al. |
| 5,450,354 A | 9/1995 | Sawada et al. |
| 5,479,638 A | 12/1995 | Assar et al. |
| 5,519,847 A | 5/1996 | Fandrich et al. |
| 5,530,705 A | 6/1996 | Malone |
| 5,537,555 A | 7/1996 | Landry |
| 5,551,003 A | 8/1996 | Mattson et al. |

(Continued)

FOREIGN PATENT DOCUMENTS

| | | |
|---|---|---|
| EP | 1465203 A1 | 10/2004 |
| EP | 1 956 489 A2 | 8/2008 |

(Continued)

OTHER PUBLICATIONS

International Search Report and Written Opinion dated Nov. 7, 2014, received in International Patent Application No. PCT/US2014/049732, which corresponds to U.S. Appl. No. 14/334,350, 13 pages (Fitzpatrick).

(Continued)

*Primary Examiner* — April Y Blair
*Assistant Examiner* — Thien D Nguyen
(74) *Attorney, Agent, or Firm* — Morgan, Lewis & Bockius LLP

(57) ABSTRACT

A method of bandwidth optimization in a non-volatile memory system includes: retrieving hard data bits; generating soft information from the hard data bits; applying a lossless compression to the soft information for calculating syndrome bits; and executing a low density parity check (LDPC) iterative decode on the hard data bits and the syndrome bits.

20 Claims, 4 Drawing Sheets

(56) References Cited

U.S. PATENT DOCUMENTS

| | | |
|---|---|---|
| 5,657,332 A | 8/1997 | Auclair et al. |
| 5,666,114 A | 9/1997 | Brodie et al. |
| 5,708,849 A | 1/1998 | Coke et al. |
| 5,784,174 A | 7/1998 | Fujino et al. |
| 5,790,828 A | 8/1998 | Jost |
| 5,930,504 A | 7/1999 | Gabel |
| 5,943,692 A | 8/1999 | Marberg et al. |
| 5,949,785 A | 9/1999 | Beasley |
| 5,963,983 A | 10/1999 | Sakakura et al. |
| 5,982,664 A | 11/1999 | Watanabe |
| 6,000,006 A | 12/1999 | Bruce et al. |
| 6,016,560 A | 1/2000 | Wada et al. |
| 6,018,304 A | 1/2000 | Bessios |
| 6,034,897 A | 3/2000 | Estakhri et al. |
| 6,069,827 A | 5/2000 | Sinclair |
| 6,070,074 A | 5/2000 | Perahia et al. |
| 6,091,652 A | 7/2000 | Haehn et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,275,436 B1 | 8/2001 | Tobita et al. |
| 6,295,592 B1 | 9/2001 | Jeddeloh et al. |
| 6,311,263 B1 | 10/2001 | Barlow et al. |
| 6,345,367 B1 | 2/2002 | Sinclair |
| 6,356,447 B2 | 3/2002 | Scafidi |
| 6,381,176 B1 | 4/2002 | Kim et al. |
| 6,381,670 B1 | 4/2002 | Lee et al. |
| 6,412,080 B1 | 6/2002 | Fleming et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,529,997 B1 | 3/2003 | Debiez et al. |
| 6,552,581 B1 | 4/2003 | Gabara |
| 6,587,915 B1 | 7/2003 | Kim |
| 6,618,249 B2 | 9/2003 | Fairchild |
| 6,661,503 B1 | 12/2003 | Yamaguchi et al. |
| 6,678,788 B1 | 1/2004 | O'Connell |
| 6,728,913 B1 | 4/2004 | Parker |
| 6,757,768 B1 | 6/2004 | Potter et al. |
| 6,763,424 B2 | 7/2004 | Conley |
| 6,775,792 B2 | 8/2004 | Ulrich et al. |
| 6,778,387 B2 | 8/2004 | Fairchild |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,850,443 B2 | 2/2005 | Lofgren et al. |
| 6,854,070 B2 | 2/2005 | Johnson et al. |
| 6,871,257 B2 | 3/2005 | Conley et al. |
| 6,871,304 B2 | 3/2005 | Hadjihassan et al. |
| 6,895,464 B2 | 5/2005 | Chow et al. |
| 6,903,972 B2 | 6/2005 | Lasser et al. |
| 6,906,961 B2 | 6/2005 | Eggleston et al. |
| 6,975,028 B1 | 12/2005 | Wayburn et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,032,123 B2 | 4/2006 | Kane et al. |
| 7,043,505 B1 | 5/2006 | Teague et al. |
| 7,082,495 B2 | 7/2006 | DeWhitt et al. |
| 7,100,002 B2 | 8/2006 | Shrader et al. |
| 7,107,389 B2 | 9/2006 | Inagaki et al. |
| 7,111,293 B1 | 9/2006 | Hersh et al. |
| 7,139,864 B2 | 11/2006 | Bennett et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,233,497 B2 | 6/2007 | Simon et al. |
| 7,243,186 B2 | 7/2007 | Liang et al. |
| 7,298,888 B2 | 11/2007 | Hamar |
| 7,328,377 B1 | 2/2008 | Lewis et al. |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,516,267 B2 | 4/2009 | Coulson et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry et al. |
| 7,613,871 B2 | 11/2009 | Tanaka et al. |
| 7,620,710 B2 | 11/2009 | Kottomtharayil et al. |
| 7,620,769 B2 | 11/2009 | Lee et al. |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,681,106 B2 | 3/2010 | Jarrar et al. |
| 7,685,494 B1 | 3/2010 | Varnica et al. |
| 7,693,422 B2 | 4/2010 | Alicherry et al. |
| 7,707,481 B2 | 4/2010 | Kirschner et al. |
| 7,738,502 B2 | 6/2010 | Chang et al. |
| 7,743,216 B2 | 6/2010 | Lubbers et al. |
| 7,761,655 B2 | 7/2010 | Mizushima et al. |
| 7,774,390 B2 | 8/2010 | Shin |
| 7,818,525 B1 | 10/2010 | Frost et al. |
| 7,827,348 B2 | 11/2010 | Lee et al. |
| 7,830,164 B2 | 11/2010 | Earle et al. |
| 7,840,762 B2 | 11/2010 | Oh et al. |
| 7,853,749 B2 | 12/2010 | Kolokowsky |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich |
| 7,979,614 B1 | 7/2011 | Yang |
| 7,996,642 B1 | 8/2011 | Smith |
| 8,000,161 B2 | 8/2011 | Stan et al. |
| 8,001,135 B2 | 8/2011 | Fume et al. |
| 8,006,161 B2 | 8/2011 | Lestable et al. |
| 8,010,738 B1 | 8/2011 | Chilton et al. |
| 8,028,123 B2 | 9/2011 | Kilzer et al. |
| 8,032,724 B1 | 10/2011 | Smith |
| 8,046,645 B2 | 10/2011 | Hsu et al. |
| 8,051,241 B2 | 11/2011 | Feldman et al. |
| 8,069,390 B2 | 11/2011 | Lin |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,190,967 B2 | 5/2012 | Hong et al. |
| 8,205,028 B1 | 6/2012 | Sakarda |
| 8,209,677 B2 | 6/2012 | Shintani et al. |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,250,621 B2 | 8/2012 | Cha |
| 8,254,172 B1 | 8/2012 | Kan |
| 8,254,181 B2 | 8/2012 | Hwang et al. |
| 8,259,506 B1 | 9/2012 | Sommer et al. |
| 8,289,801 B2 | 10/2012 | Smith et al. |
| 8,296,534 B1 | 10/2012 | Gupta et al. |
| 8,312,349 B2 | 11/2012 | Reche et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,385,117 B2 | 2/2013 | Sakurada et al. |
| 8,386,700 B2 | 2/2013 | Olbrich et al. |

(56) References Cited

U.S. PATENT DOCUMENTS

| | | |
|---|---|---|
| 8,386,860 B2 | 2/2013 | Tseng et al. |
| 8,397,101 B2 | 3/2013 | Goss et al. |
| 8,407,409 B2 | 3/2013 | Kawaguchi |
| 8,412,985 B1 | 4/2013 | Bowers et al. |
| 8,451,664 B2 | 5/2013 | Radke et al. |
| 8,464,106 B2 | 6/2013 | Filor et al. |
| 8,503,238 B1 | 8/2013 | Wu et al. |
| 8,504,890 B2 | 8/2013 | Sharon et al. |
| 8,521,981 B2 | 8/2013 | Strauss et al. |
| 8,533,550 B2 | 9/2013 | Khan |
| 8,560,770 B2 | 10/2013 | Haines et al. |
| 8,601,203 B2 | 12/2013 | Holbrook et al. |
| 8,612,669 B1 | 12/2013 | Syu et al. |
| 8,612,804 B1 | 12/2013 | Kang et al. |
| 8,661,184 B2 | 2/2014 | Wood et al. |
| 8,694,811 B2 | 4/2014 | Raju et al. |
| 8,725,931 B1 | 5/2014 | Kang |
| 8,750,052 B2 | 6/2014 | Aoki et al. |
| 8,793,556 B1 | 7/2014 | Northcott et al. |
| 8,799,747 B2 | 8/2014 | Goss et al. |
| 8,832,506 B2 | 9/2014 | Griffin et al. |
| 8,862,818 B1 | 10/2014 | Ozdemir |
| 8,880,838 B2 | 11/2014 | Kaiser et al. |
| 8,984,216 B2 | 3/2015 | Fillingim |
| 9,043,668 B2 | 5/2015 | Goss et al. |
| 9,063,844 B2 | 6/2015 | Higgins et al. |
| 9,069,468 B2 | 6/2015 | Mehra et al. |
| 9,116,401 B2 | 8/2015 | Kim et al. |
| 2002/0024846 A1 | 2/2002 | Kawahara et al. |
| 2002/0056025 A1 | 5/2002 | Qiu et al. |
| 2002/0083299 A1 | 6/2002 | Van Huben et al. |
| 2002/0152305 A1 | 10/2002 | Jackson et al. |
| 2002/0156891 A1 | 10/2002 | Ulrich et al. |
| 2002/0159285 A1 | 10/2002 | Morley et al. |
| 2002/0162075 A1 | 10/2002 | Talagala et al. |
| 2002/0165896 A1 | 11/2002 | Kim |
| 2003/0033308 A1 | 2/2003 | Patel et al. |
| 2003/0041299 A1 | 2/2003 | Kanazawa et al. |
| 2003/0043829 A1 | 3/2003 | Rashid |
| 2003/0046603 A1 | 3/2003 | Harari et al. |
| 2003/0074592 A1 | 4/2003 | Hasegawa |
| 2003/0088805 A1 | 5/2003 | Majni et al. |
| 2003/0093628 A1 | 5/2003 | Matter et al. |
| 2003/0163633 A1 | 8/2003 | Aasheim et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0080985 A1 | 4/2004 | Chang et al. |
| 2004/0088511 A1 | 5/2004 | Bacon et al. |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2004/0252670 A1 | 12/2004 | Rong et al. |
| 2005/0021904 A1 | 1/2005 | Iaculo et al. |
| 2005/0038792 A1 | 2/2005 | Johnson |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0076102 A1 | 4/2005 | Chen et al. |
| 2005/0114587 A1 | 5/2005 | Chou et al. |
| 2005/0144516 A1 | 6/2005 | Gonzalez et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0015683 A1 | 1/2006 | Ashmore et al. |
| 2006/0020745 A1 | 1/2006 | Conley et al. |
| 2006/0022054 A1 | 2/2006 | Elhamias et al. |
| 2006/0039196 A1 | 2/2006 | Gorobets et al. |
| 2006/0053246 A1 | 3/2006 | Lee |
| 2006/0080505 A1 | 4/2006 | Arai et al. |
| 2006/0085671 A1 | 4/2006 | Majni et al. |
| 2006/0136570 A1 | 6/2006 | Pandya |
| 2006/0136682 A1 | 6/2006 | Haridas et al. |
| 2006/0143365 A1 | 6/2006 | Kikuchi |
| 2006/0143475 A1 | 6/2006 | Herbert et al. |
| 2006/0156177 A1 | 7/2006 | Kottapalli et al. |
| 2006/0195650 A1 | 8/2006 | Su et al. |
| 2006/0253641 A1 | 11/2006 | Gatzemeier et al. |
| 2006/0256624 A1 | 11/2006 | Eggleston et al. |
| 2006/0259528 A1 | 11/2006 | Dussud et al. |
| 2006/0282644 A1 | 12/2006 | Wong |
| 2006/0294574 A1 | 12/2006 | Cha |
| 2007/0011413 A1 | 1/2007 | Nonaka et al. |
| 2007/0050536 A1 | 3/2007 | Kolokowsky |
| 2007/0058446 A1 | 3/2007 | Hwang et al. |
| 2007/0061511 A1 | 3/2007 | Faber |
| 2007/0061597 A1 | 3/2007 | Holtzman et al. |
| 2007/0067598 A1 | 3/2007 | Fujimoto |
| 2007/0076479 A1 | 4/2007 | Kim et al. |
| 2007/0079152 A1 | 4/2007 | Winick et al. |
| 2007/0081408 A1 | 4/2007 | Kwon et al. |
| 2007/0083697 A1 | 4/2007 | Birrell et al. |
| 2007/0083779 A1 | 4/2007 | Misaka et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0208901 A1 | 9/2007 | Purcell et al. |
| 2007/0226592 A1 | 9/2007 | Radke |
| 2007/0234004 A1 | 10/2007 | Oshima et al. |
| 2007/0234143 A1 | 10/2007 | Kim |
| 2007/0245061 A1 | 10/2007 | Harriman |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028246 A1 | 1/2008 | Witham |
| 2008/0046630 A1 | 2/2008 | Lasser |
| 2008/0052446 A1 | 2/2008 | Lasser et al. |
| 2008/0077841 A1 | 3/2008 | Gonzalez et al. |
| 2008/0077937 A1 | 3/2008 | Shin et al. |
| 2008/0082736 A1 | 4/2008 | Chow et al. |
| 2008/0086677 A1 | 4/2008 | Yang et al. |
| 2008/0126720 A1 | 5/2008 | Danilak |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0183918 A1 | 7/2008 | Dhokia et al. |
| 2008/0189588 A1 | 8/2008 | Tanaka et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0263289 A1 | 10/2008 | Hosoya et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313505 A1 | 12/2008 | Lee et al. |
| 2009/0003058 A1 | 1/2009 | Kang |
| 2009/0006900 A1 | 1/2009 | Lastras-Montano et al. |
| 2009/0019321 A1 | 1/2009 | Radke |
| 2009/0037652 A1 | 2/2009 | Yu et al. |

(56) References Cited

U.S. PATENT DOCUMENTS

| | | |
|---|---|---|
| 2009/0070651 A1 | 3/2009 | Diggs et al. |
| 2009/0083587 A1 | 3/2009 | Ng et al. |
| 2009/0089485 A1 | 4/2009 | Yeh |
| 2009/0091990 A1 | 4/2009 | Park et al. |
| 2009/0109786 A1 | 4/2009 | Ye et al. |
| 2009/0125670 A1 | 5/2009 | Keays |
| 2009/0138654 A1 | 5/2009 | Sutardja |
| 2009/0144598 A1 | 6/2009 | Yoon et al. |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0164710 A1 | 6/2009 | Choi et al. |
| 2009/0168525 A1 | 7/2009 | Olbrich et al. |
| 2009/0172248 A1 | 7/2009 | You |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0179707 A1 | 7/2009 | Higashino |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228634 A1 | 9/2009 | Nakamura et al. |
| 2009/0228761 A1* | 9/2009 | Perlmutter et al. ........... 714/763 |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |
| 2009/0296466 A1 | 12/2009 | Kim et al. |
| 2009/0296486 A1 | 12/2009 | Kim et al. |
| 2009/0300238 A1 | 12/2009 | Panabaker et al. |
| 2009/0319864 A1 | 12/2009 | Shrader |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0061151 A1 | 3/2010 | Miwa et al. |
| 2010/0082890 A1 | 4/2010 | Heo et al. |
| 2010/0103737 A1 | 4/2010 | Park |
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0161936 A1 | 6/2010 | Royer et al. |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0332726 A1 | 12/2010 | Wang |
| 2011/0002224 A1 | 1/2011 | Tamura |
| 2011/0016239 A1 | 1/2011 | Stenfort |
| 2011/0055455 A1 | 3/2011 | Post et al. |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0083060 A1 | 4/2011 | Sakurada et al. |
| 2011/0099342 A1 | 4/2011 | Ozdemir |
| 2011/0107144 A1 | 5/2011 | Ohara |
| 2011/0113281 A1 | 5/2011 | Zhang et al. |
| 2011/0131365 A1 | 6/2011 | Zhang et al. |
| 2011/0131444 A1 | 6/2011 | Buch et al. |
| 2011/0131447 A1 | 6/2011 | Prakash et al. |
| 2011/0132000 A1 | 6/2011 | Deane et al. |
| 2011/0138100 A1 | 6/2011 | Sinclair |
| 2011/0145473 A1 | 6/2011 | Maheshwari |
| 2011/0161775 A1* | 6/2011 | Weingarten ................... 714/755 |
| 2011/0173378 A1 | 7/2011 | Filor et al. |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0205823 A1 | 8/2011 | Hemink et al. |
| 2011/0209032 A1 | 8/2011 | Choi et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0023144 A1 | 1/2012 | Rub |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0079348 A1* | 3/2012 | Naeimi ........................ 714/763 |
| 2012/0079355 A1 | 3/2012 | Patapoutian et al. |
| 2012/0096217 A1 | 4/2012 | Son et al. |
| 2012/0110250 A1 | 5/2012 | Sabbag et al. |
| 2012/0124046 A1 | 5/2012 | Provenzano |
| 2012/0124273 A1 | 5/2012 | Goss et al. |
| 2012/0151253 A1 | 6/2012 | Horn |
| 2012/0151260 A1 | 6/2012 | Zimmermann et al. |
| 2012/0170365 A1 | 7/2012 | Kang et al. |
| 2012/0185706 A1 | 7/2012 | Sistla et al. |
| 2012/0195126 A1 | 8/2012 | Roohparvar |
| 2012/0213004 A1 | 8/2012 | Yun et al. |
| 2012/0216085 A1 | 8/2012 | Weingarten et al. |
| 2012/0236656 A1 | 9/2012 | Cometti |
| 2012/0239858 A1 | 9/2012 | Melik-Martirosian |
| 2012/0239976 A1 | 9/2012 | Cometti et al. |
| 2012/0254686 A1 | 10/2012 | Esumi et al. |
| 2012/0266011 A1 | 10/2012 | Storer et al. |
| 2012/0266048 A1 | 10/2012 | Chung et al. |
| 2012/0278530 A1 | 11/2012 | Ebsen |
| 2012/0278531 A1 | 11/2012 | Horn |
| 2012/0284587 A1 | 11/2012 | Yu et al. |
| 2012/0297113 A1 | 11/2012 | Belluomini et al. |
| 2012/0311402 A1 | 12/2012 | Tseng et al. |
| 2012/0317334 A1* | 12/2012 | Suzuki et al. ................. 711/103 |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0061019 A1 | 3/2013 | Fitzpatrick et al. |
| 2013/0073788 A1 | 3/2013 | Post et al. |
| 2013/0080691 A1 | 3/2013 | Weingarten et al. |
| 2013/0094289 A1 | 4/2013 | Sridharan et al. |
| 2013/0100600 A1 | 4/2013 | Yin et al. |
| 2013/0104005 A1 | 4/2013 | Weingarten et al. |
| 2013/0124792 A1 | 5/2013 | Melik-Martirosian et al. |
| 2013/0151753 A1 | 6/2013 | Jeon et al. |
| 2013/0198436 A1 | 8/2013 | Bandic et al. |
| 2013/0205102 A1 | 8/2013 | Jones et al. |
| 2013/0232290 A1 | 9/2013 | Ish et al. |
| 2013/0238833 A1 | 9/2013 | Vogan et al. |
| 2013/0265825 A1 | 10/2013 | Lassa |

(56) References Cited

U.S. PATENT DOCUMENTS

| | | | |
|---|---|---|---|
| 2013/0332791 | A1 | 12/2013 | Chu |
| 2014/0036589 | A1* | 2/2014 | Parthasarathy et al. ... 365/185.09 |
| 2014/0059359 | A1 | 2/2014 | Bahirat |
| 2014/0108891 | A1 | 4/2014 | Strasser et al. |
| 2014/0129874 | A1 | 5/2014 | Zaltsman et al. |
| 2014/0158525 | A1 | 6/2014 | Greene |
| 2014/0181370 | A1 | 6/2014 | Cohen et al. |
| 2014/0208174 | A1 | 7/2014 | Ellis et al. |
| 2014/0372777 | A1 | 12/2014 | Reller et al. |

FOREIGN PATENT DOCUMENTS

| | | |
|---|---|---|
| EP | 1 990 921 A2 | 11/2008 |
| EP | 2 498 259 A2 | 9/2012 |
| JP | 2002-532806 | 10/2002 |
| JP | 2012129859 A | 7/2012 |
| WO | WO 2007/036834 | 4/2007 |
| WO | WO 2007/080586 | 7/2007 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/042296 A1 | 4/2009 |
| WO | WO 2009/058140 | 5/2009 |
| WO | WO 2009/084724 | 7/2009 |
| WO | WO 2009/134576 | 11/2009 |
| WO | WO 2011/156466 A2 | 12/2011 |

OTHER PUBLICATIONS

International Search Report and Written Opinoin dated Oct. 17, 2014, received in International Patent Application No. PCT/US2014/049734, which corresponds to U.S. Appl. No. 14/332,259, 8 pages (Higgins).
International Search Report and Written Opinion dated Oct. 23, 2014, received in International Patent Application No. PCT/US2014/049736, which corresponds to U.S. Appl. No. 14/446,249 8 pages (Fitzpatrick).
International Search Report and Written Opinion dated Nov. 5, 2014, received in International Patent Applciation No. PCT/US2014/049282, which corresponds to U.S. Appl. No. 13/957,407, 12 pages (Fitzpatrick).
Barr, Introduction to Watchdog Timers, Oct. 2001, 3 pgs.
Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).

Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb, 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Cooke, "Introduction to Flash Memory (T1A)," Flash Memory Summit, Aug. 22, 2008, Micron Technology, Inc., 102 pages.
Gal et al., "Algotithms and Data Structures for Flash Memories," ACM Computing Surveys, Jun. 2005, vol. 37, No. 2, 30 pages.
IBM Corporation, "Systems Management, Work Management," Version 5, Release 4, 9th Edition, Feb. 2006, pp. 1-21.
O'Brien, "Smart Storage Systems Optimus SAS Enterprise SSD Review," Smart Storage Systems, Oct. 9, 2012, 44 pages.
Spanjer, "Flash Management—Why and How?" Smart Modular Technologies, Nov. 2009, http://www.scantee.de/fileadmin/pdf/Smart_Modular/Flash-Management.pdf, 14 pages.
Texas Instruments, "Power Management IC for Digital Set Top Boxes," SLVSA10A, Sep. 2009, pp. 1-22.
International Search Report and Written Opinion dated Dec. 20, 2013, received in PCT/US2013/045282, which corresponds to U.S. Appl. No. 13/493,949, 7 pages (Ellis).
International Search Report and Written Opinion dated Jun. 12, 2014, received in PCT/US2014/018972, which corresponds to U.S. Appl. No. 13/779,352, 12 pages (Schmier).

(56) References Cited

OTHER PUBLICATIONS

International Search Report and Written Opinion dated May 14, 2014, received in International Patent Application No. PCT/US2014/017168, which corresponds to U.S. Appl. No. 14/076,115, 6 pages (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

Ulinktech, "ATA Command Table (in Alphabetic Order)," Feb. 6, 2011, https://web.archive.org/web/2011020606820/http://www.ulinktech.com/downloads/AT, 6 pages.

International Search Report and Written Opinion dated Aug. 22, 2014, received in International Patent Application No. PCT/US2014/032978, which corresponds to U.S. Appl. No. 14/081,992, 10 pages (Ellis).

International Search Report dated Mar. 25, 2014, received in International Patent Application No. PCT/US2013/072400, which corresponds to U.S. Appl. No. 13/690,337, 3 pages (Ellis).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31, 2014, received in International Patent Application No. PCT/US2014/031465, which corresponds to U.S. Appl. No. 13/851,928, 13 pages (Ellis).

International Search Report and Written Opinion dated Jul. 31, 2014, received in International Patent Application No. PCT/US2014/033876, which corresponds to U.S. Appl. No. 13/861,326, 9 pages (Fitzpatrick).

Huang et al., "A concatenation scheme of LDPC codes and source codes for flash memories", EURASIP Journal on Advances in Signal Processing 2012, A SpringerOpen Journal, pp. 1-8.

Narayanan et al., "Migrating Server Storage to SSDs: Analysis of Tradeoffs," Computer Systems, Apr. 2009, 12 pages.

Shiraz et al., "Block Aging Prevention Technique (BAP) for Flash Based Solid State Disks," 7th International Conference on Emerging Technologies (ICET), Sep. 5, 2011, 6 pages.

Tai et al, "Prolongation of Lifetime and the Evaluation Method of Dependable SSD,"25 International Symposium on Defect and Fault Tolerance in VLSI Systems, 2010, NJ, USA, 8 pages.

Tseng et al., "Understanding the Impact of Power Loss on Flash Memory," DAC'11, Jun. 5-10, 2011, San Diego, California, 6 pages.

Yimo et al., "WeLe-RAID: A SSD-Based RAID for System Endurance and Performance," Jan. 2011, Network and Parallel Computing, Springer, 14 pages.

International Search Report and Written Opinion dated Jan. 9, 2015, received in International Patent Application No. PCT/US2014/049731, which corresponds to U.S. Appl. No. 14/334,324, 9 pages (Fitzpatrick).

International Search Report and Written Opinion dated Feb. 18, 2015, received in International Patent Application No. PCT/US2014/065401, which corresponds to U.S. Appl. No. 14/082,031, 9 pages (Higgins).

International Search Report dated Apr. 15, 2014, received in International Patent Application No. PCT/US2013/078340, which corresponds to U.S. Appl. No. 13/746,542, 11 pages (Ellis).

Online Merriam Webster Dictionary, definition of "Distinct" from Jun. 12, 2011, https://web.archive.org/web/20110612181129/http://www2.merriam-webster.com/cgi-bin/mwdictadu?book=Dictionary&va=distinct.

* cited by examiner

BANDWIDTH OPTIMIZATION IN A NON-VOLATILE MEMORY SYSTEM

CROSS REFERENCE TO RELATED APPLICATION

This application claims the benefit of U.S. Provisional Patent Application Ser. No. 61/767,236 filed Feb. 20, 2013, which is incorporated herein by reference in its entirety.

TECHNICAL FIELD

The present invention relates generally to a non-volatile memory system, and more particularly to bandwidth optimization in the non-volatile memory when using for instance error correction.

BACKGROUND ART

Recently, there has been a growing demand for memory storage devices using NAND Flash memory due to their attractive features such as low power consumption, high data throughput, and small size. The original NAND flash architecture was referred to as single level cell (SLC) since it would only store one bit per in each memory cell (a floating gate transistor). More recent devices can store multiple bits per cell and are referred to as multi-level cell (MLC) flash.

In a solid state drive (SSD), a common requirement is that the drive maintains constant performance throughout its life. Some measures of performance are the operating power, the read throughput, and the average latency. In practice, reliability of the information stored in the flash decreases due to several factors such as cell to cell interference, charge leakage, over programming and read/write disturbance. These effects will become more severe with the age of the flash and the number of stored bits per cell. To resolve these issues, error correction codes (ECC) have been used to ensure data integrity and reliable data storage throughout the life of flash memory cells. By applying ECC, additional error correction bits are sent along with the original data bits to protect the user data from errors caused by the weak or failing flash memory cells. Unfortunately the addition of the error correction bits can reduce usable capacity and increase the bandwidth used on the memory interface. The fixed structure of the error correction codes can unnecessarily burden the bandwidth of the transfer from the memory device when no correction is necessary but can be insufficient to correct the user data as the flash memory cells wear.

Thus, a need still remains for a non-volatile memory system with bandwidth optimization that can provide enhanced performance and longevity of a non-volatile storage system, such as a solid state drive, without unnecessarily reducing capacity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The present disclosure provides a method of operation of a non-volatile memory system including: retrieving hard data bits representing the user data. The non-volatile memory system generates soft information from the hard data bits without adding a capacity burden to the solid state drive. The non-volatile memory system applies a lossless compression to the soft information for calculating syndrome bits for optimizing the bandwidth of error correction when it is needed. The non-volatile memory system also executes a low density parity check (LDPC) iterative decode on the hard data bits and the syndrome bits for increasing the reliability of the user data without unnecessarily impacting capacity or performance.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
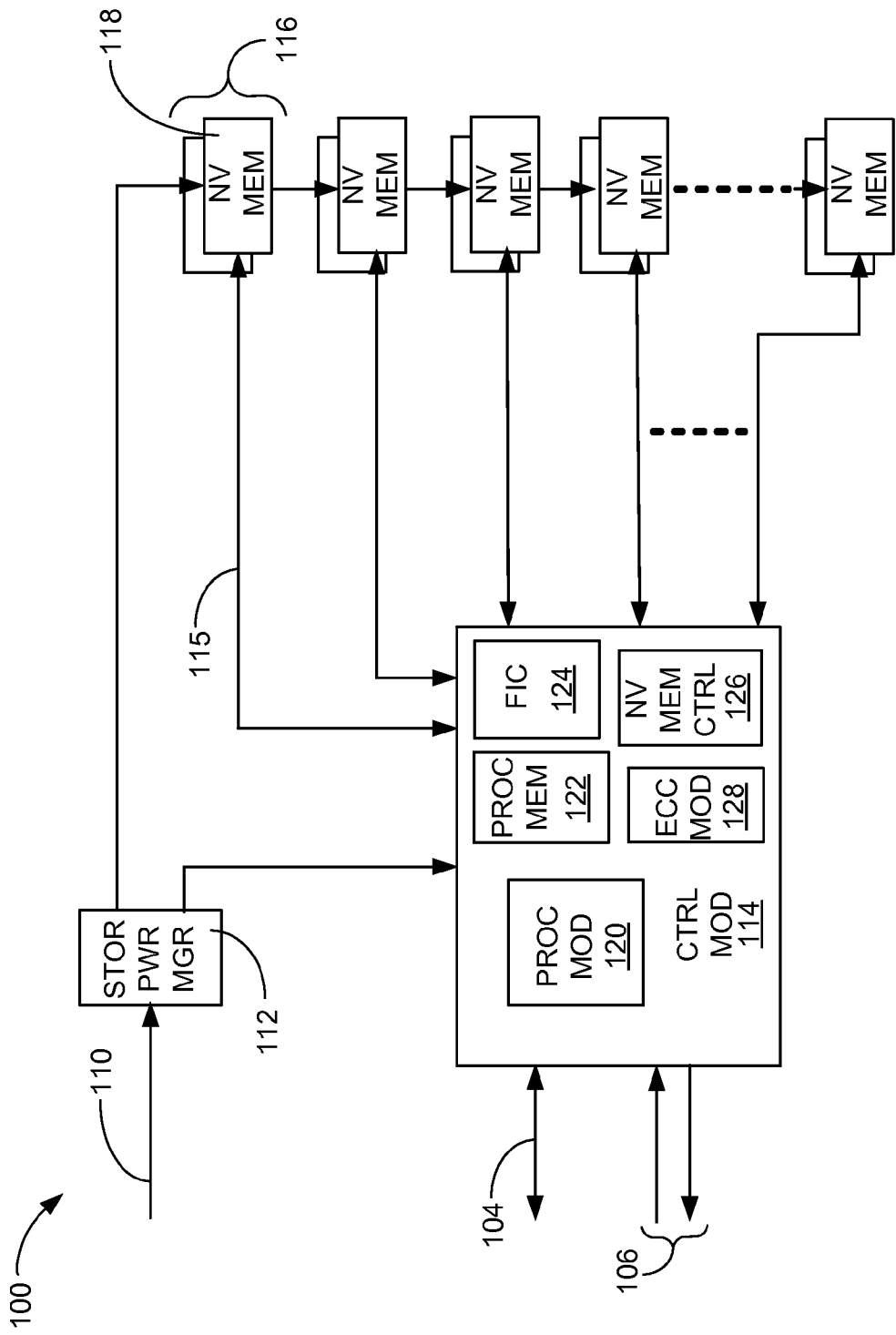
FIG. 1 is a block diagram of a non-volatile memory system with error correction mechanism in an embodiment of the present invention.

The following embodiments are described in sufficient detail to enable those skilled in the art to make and use the claimed invention. It is to be understood that other embodiments would be evident based on the present disclosure, and that system, process, or mechanical changes may be made without departing from the scope of the claimed invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation.

The same numbers are used in all the drawing figures to relate to the same elements. The embodiments have been numbered first embodiment, second embodiment, etc. as a matter of descriptive convenience and are not intended to have any other significance or provide limitations for the present invention.

The present invention provides a method of operation of a non-volatile memory system including: retrieving hard data bits; generating soft information from the hard data bits; applying a lossless compression to the soft information for calculating syndrome bits; and executing a low density parity check (LDPC) iterative decode on the hard data bits and the syndrome bits.

The present invention provides a non-volatile memory system, including: a destination register for retrieving hard data bits; a soft information module, coupled to the destination register, for capturing a reliability of the hard data bits; a lossless compression module, coupled to the soft information module, for calculating syndrome bits; and an error correction module, coupled to the lossless compression module, for executing a low density parity check (LDPC) iterative decode on the hard data bits and the syndrome bits.

Referring now to FIG. 1, therein is shown a block diagram of a non-volatile memory system 100 with error correction mechanism in an embodiment of the present invention. The block diagram of the non-volatile memory system 100 depicts a host data bus 104, a command interface 106, and a system power interface 110 coupled to a storage power manager 112.

The storage power manager 112 can provide operational power and alerts to a controller module 114 and an array 116 of a non-volatile memory device 118. The non-volatile memory device 118 can be NAND flash memory, single-level cell (SLC) flash memory, or multi-level cell (MLC) flash memory. The array 116 of the non-volatile memory device 118 can be coupled through a flash data bus 115 to the controller module 114. The controller module 114 can be a hardware module having a processor module 120, a processor memory module 122, a flash interface controller 124, a non-volatile memory controller 126, and an error correction module 128, such as a low density parity check (LDPC) iterative decoder module.

The processor module 120 can perform maintenance and support tasks for the non-volatile memory system 100. The processor memory module 122 can be coupled to the processor module 120 to operate as data cache, temporary storage, instruction storage, and interface state memory.

The flash interface controller 124 is a hardware structure coupled between the flash data bus 115, and the error correction module 128. The flash interface controller 124 can manage the transfer of hard data bits read from the non-volatile memory device 118. The hardware for the flash interface controller 124 can be a multiplexed structure that uses the flash data bus 115 to transfer either the hard data bits read from the non-volatile memory device 118 or syndrome bits, representing the reliability of the hard data bits, which are processed for the error correction module 128.

The non-volatile memory controller 126 can be a dedicated processor or hardware module used to manage data written to the non-volatile memory device 118 as well as monitoring use patterns of the non-volatile memory device 118. The use leveling and configuration management of erase blocks within the non-volatile memory device 118 are managed by the non-volatile memory controller 126.

Data written to the non-volatile memory device 118 can be randomized for either security reasons or for endurance and retention requirements. The resulting data is known to have high entropy, such as 50% 1's and 50% 0's. The number of data bits written at a value of 1 or 0 can be predicted. As the non-volatile memory device 118 ages a ratio of the number of 1's to 0's will change due to charge depletion in the non-volatile memory device 118. The charge depletion can occur due to the age of the data or an excessive number of reads of the data in the non-volatile memory device 118.

In normal operation, spurious data errors can be corrected by the error correction module 128 without re-reading the erroneous data blocks. As the charge is depleted with a given threshold voltage ($V_{th}$), the ratio of the number of 1's to 0's can change. As the number of bit errors increases, soft correction bits can be needed by the error correction module 128 to provide corrected data to the host data bus 104.

The processor module 120 can detect the increasing use of the error correction module 128. The processor module 120 can configure the flash interface controller 124 in order to invoke changes in the processing of the syndrome bits to the error correction module 128. The output of the flash interface controller 124 can steer the hard data bits to the error correction module 128 and the syndrome bits to additional logic to aid in the correction process.

It is understood that the activation of the flash interface controller 124 can be part of an error recovery process or as part of a continuous monitoring of the condition of the data within the non-volatile memory device 118. It is further understood that the adjustments of the threshold voltage ($V_{th}$) can be implemented by the non-volatile memory controller 126 to automatically apply to the non-volatile memory device 118 without intervention of the processor module 120.

It has been discovered that the flash interface controller 124 can aid in the correction of the hard data read from the non-volatile memory device 118 while minimizing the use of additional power and latency. It has further been discovered that the flash interface controller 124 can quickly assist in the identification of suspect bits in the hard data read from the non-volatile memory device 118 while minimizing the utilization of additional power and latency.

Figure 2:
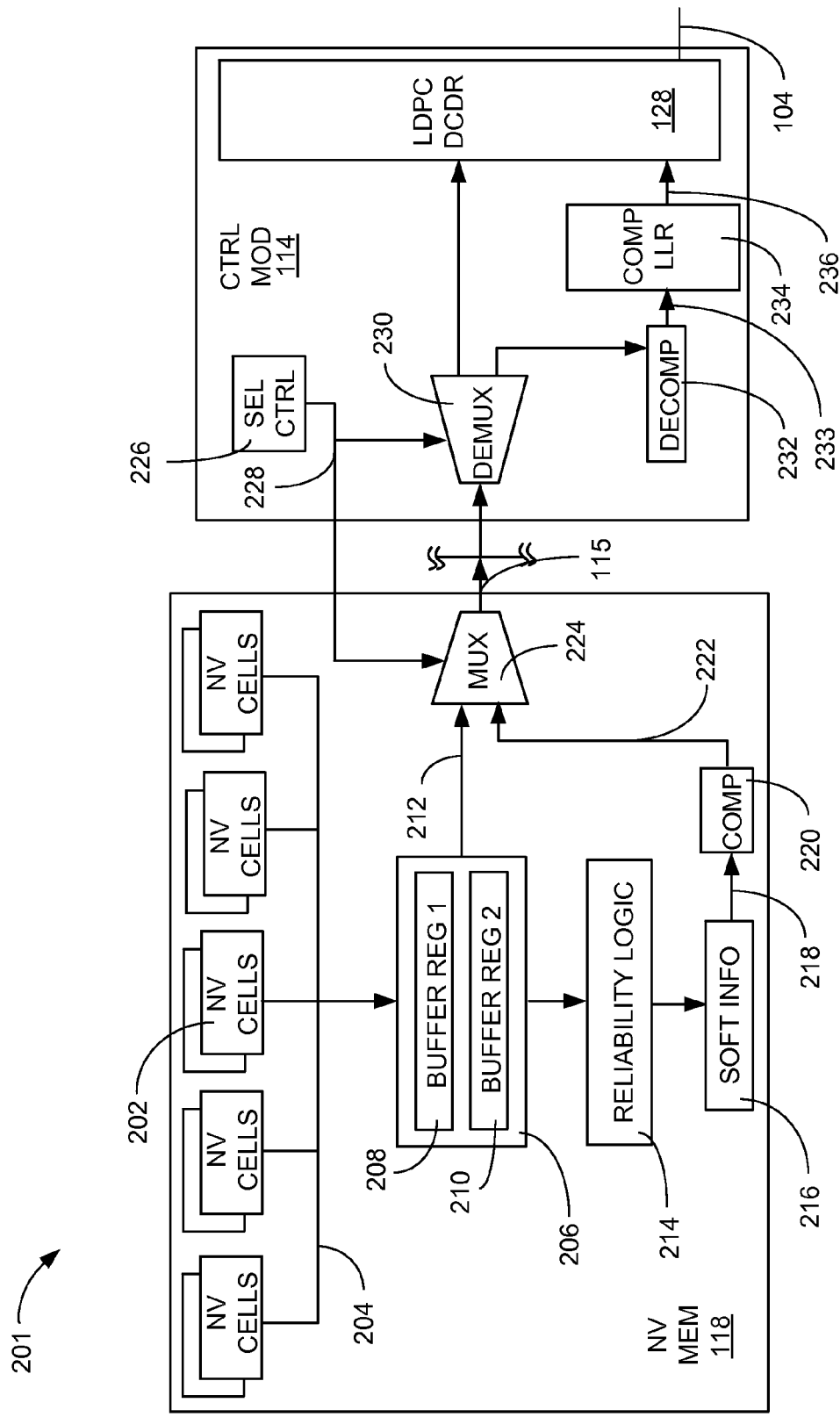
FIG. 2 is a detailed block diagram of an exemplary read path of the non-volatile memory system of FIG. 1.

Referring now to FIG. 2, therein is shown a detailed block diagram of an exemplary read path 201 of the non-volatile memory system 100 of FIG. 1. The detailed block diagram of the exemplary read path 201 of the non-volatile memory system 100 depicts the non-volatile memory device 118 coupled to the controller module 114 by the flash data bus 115.

The non-volatile memory device 118 can include a number of non-volatile memory cells 202 coupled through a read bus 204 to a destination register 206. The destination register 206 can include a first read register 208 and a second read register 210. The first read register 208 and the second read register 210 can each receive the hard data bits from the read bus 204 at a different threshold voltage ($V_{TH}$) (not shown). The subsequent reads of the same data location using different levels of the threshold voltage can load the same data in the first read register 208 and the second read register 210 or it can cause some of the bits to change value. In the event none of the bits change, the reliability of all of the bits is known with high confidence.

An output of the destination register 206 can be hard data bits 212. If the confidence in all of the hard data bits 212 is high, the code word represented by the hard data bits 212 can be correctly decoded by the error correction module 128 and presented on the host data bus 104. It is understood that while the hard data bits 212 is shown as a single line, the number of the hard data bits 212 represented in a code word decoded by the error correction module 128 can be 8 bits, 16 bits, 32 bits, 64 bits or some other number of bits limited only by the design of the controller module 114 and the non-volatile memory device 118.

In the event the bit values in the first read register 208 and the second read register 210 are different, the individual bits that change value are suspect and can be flagged as having a probability of being the incorrect value as transferred in the hard data bits 212. A reliability logic module 214 can compare changes of the data bits from the first read register 208, loaded at a first threshold voltage ($V_{TH}$) and the second read register 210, loaded at a second threshold voltage ($V_{TH}$), based on the change in threshold voltage ($V_{TH}$) applied to the non-volatile memory cell 202. The reliability logic module 214 can be coupled to a soft information module 216 for generation of soft information 218 indicating the probability of the correctness of the hard data bits 212. The soft information module 216 can provide access to the soft information 218.

It is understood that the destination register 206 can have additional registers beyond the first read register 208 and the second read register 210 in order to capture additional information about the number of bits that change due to changes in the threshold voltage ($V_{TH}$). It is also understood that the reliability logic module 214 can be integrated into the destination register 206. The reliability logic module 214 is shown separately to clarify the function.

A lossless compression module 220 can perform a lossless compression, such as Huffman coding, adaptive Huffman coding, Lempel Ziv, Lempel Ziv Welch, or the like, of the soft information 218. The lossless compression module 220 can reduce the size of the soft information 218 by supplying a code indicating which of the hard data bits 212 appear to be unreliable for transfer to the controller module 114. The lossless compression module 220 can reduce the transfer time and power required to convey the soft information 218 to the controller module 114. By way of an example, the lossless compression module 220 can be structured to provide the Huffman Coding of the soft information 218, which divides the soft information 218 into clusters of size "N".

The lossless compression module 220 can provide syndrome bits 222 that reflects the lossless compression of the soft information 218. The syndrome bits 222 can be coupled to a multiplexer 224 for transferring the syndrome bits 222 across the flash data bus 115. A selection controller 226 can control the data select line 228 in order to switch the multiplexer between the hard data bits 212 and the syndrome bits 222. The output of the multiplexer 224 is the flash data bus 115, which is coupled to a demultiplexer 230 for steering the hard data bits 212 to the error correction module 128 and the syndrome bits 222 to a decompression module 232.

The selection controller 226 can maintain the selection of the hard data bits 212 until a code word is not correctly decoded. Upon detecting a decode error from the error correction module 128, the selection controller 226 can select the syndrome bits 222. The syndrome bits 222 are generated during the decode process of the error correction module 128 and are waiting for transmission when the selection controller 226 switches the data select line 228.

The decompression module 232 can perform a decompression of the syndrome bits 222. The decompression module 232 can decompose the sequence of the syndrome bits 222 into cluster syndrome bits 233 without any knowledge of the hard data bits 212. A compute log likelihood ratio (LLR) module 234 can calculate the probability of an individual bit being in error from the cluster syndrome bits 233. The compute LLR module 234 can be coupled to the error correction module 128 for aiding in the LDPC iterative decode of the code word.

The compute LLR module 234 can calculate the probability that bits addressed by the decompression module 232 contain an incorrectly read bit. The compute LLR module 234 can be a hardware accelerator, combinational logic, a microprogrammed hardware sequencer, or other fast calculating combination. Probability bits 236, calculated by the compute LLR module 234, can be applied to the error correction module 128 for executing an LDPC iterative decode process of the code word represented by the hard data bits 212. Since the syndrome bits 222 represent all of the soft information 218, generation of the probability bits 236 can increase the bit correction capability to the error correction module 128 and reduce the time required to produce the corrected data for the host data bus 104 of FIG. 1.

It has been discovered that the non-volatile memory system 100 of FIG. 1 can minimize the time and energy required to perform correction of the hard data bits 212 when the error correction module 128 is unable to correctly decode the hard data bits 212. The minimization of the time and energy can be provided by the lossless compression module 220, which generates the syndrome bits 222 having a compression ratio, of the soft information 218, of between 50 and 90 percent. It has further been discovered that the transmission of the syndrome bits 222 can occur only when an error is detected by the error correction module 128, which reduces the bandwidth demand on the flash data bus 115.

Figure 3:
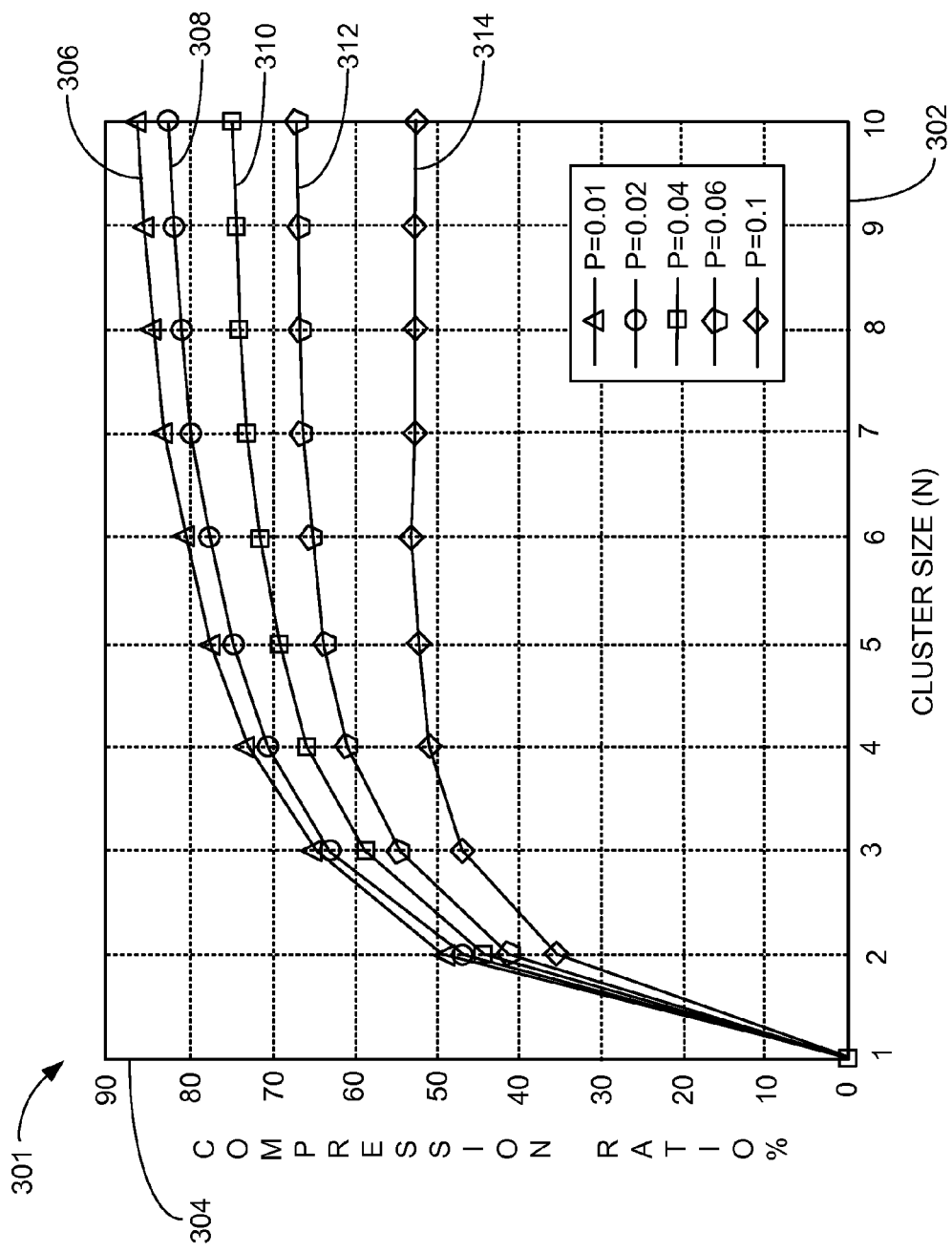
FIG. 3 is a line graph of compression performance of the syndrome bits of FIG. 2 using an exemplary Huffman Code.

Referring now to FIG. 3, therein is shown a line graph 301 of compression performance of the syndrome bits 222 of FIG. 2 using an exemplary Huffman Coding. The line graph 301 of compression performance of the syndrome bits 222 includes a horizontal axis depicting a size of a cluster 302, for dividing the soft information 218 of FIG. 2, and a vertical axis depicting a compression ratio percent 304. The compression ratio percent 304 as a function of the size of the cluster 302, for different probabilities of the unreliable bits, shows that the compression ratio percent 304 increases with increasing size of the cluster 302 up to a reliability limit.

A first compression characteristic 306 can represent that a probability of a bit being unreliable is 0.01. The first compression characteristic 306 can represent a newly written location of the non-volatile memory cells 202 of FIG. 2. Since the vast majority of the newly written bits in the non-volatile memory cells 202 will be reliable, they will have the shortest value of the syndrome bits 222. In this configuration most of the reads of the hard data bits 212 of FIG. 2 will decode without error and none of the syndrome bits 222 will be transferred. When an error is detected, most instances of the cluster 302 will be error free and can be represented by the shortest length of the syndrome bits 222.

A second compression characteristic 308 can represent that the probability of the bit being unreliable has progressed to 0.02. The second compression characteristic 308 can represent the non-volatile memory cells 202 that have been repeatedly read, written, erased, or a combination thereof. In this configuration the majority of the bits in the non-volatile memory cells 202 will be reliable and only the weaker bit locations will be unreliable. When an error is detected, most of the clusters will be error free or rarely have a single bit error in the hard data bits 212. The syndrome bits 222 indicating a single bit error located in the cluster still allows very efficient compression of the soft information 218 having a range of 71 to 83 percent for the compression ratio percent 304.

A third compression characteristic 310 can represent that the probability of the bit being unreliable has progressed to 0.04. The third compression characteristic 310 can represent the non-volatile memory cells 202 that have been repeatedly read, written, erased, or a combination thereof. In this configuration the majority of the bits in the non-volatile memory cells 202 will remain reliable and only the weaker bit locations, those having been weakly written or charge depleted from reads, will be unreliable. The probability of a single bit error within a cluster is about 3.5% and the probability of a double bit error within a cluster is 0.1%. The syndrome bits 222 indicating an occasional single bit error and a rare double bit error located in the cluster still allows very efficient compression of the soft information 218 having a range of 66 to 75 percent for the compression ratio percent 304.

A fourth compression characteristic 312 can represent that the probability of the bit being unreliable has progressed to 0.06. The fourth compression characteristic 312 can represent the non-volatile memory cells 202 that have been repeatedly read, written, erased, or a combination thereof. In this configuration the most of the bits in the non-volatile memory cells 202 will remain reliable and only the weaker bit locations or locations that have been repeatedly read will be unreliable. The syndrome bits 222 indicating a single bit error, an occasional double bit error, and a rare triple bit error located in the cluster still allows very efficient compression of the soft information 218 having a range of 61 to 68 percent for the compression ratio percent 304.

A fifth compression characteristic 314 can represent that the probability of the bit being unreliable has progressed to 0.1. The fifth compression characteristic 314 can represent the non-volatile memory cells 202 that have been repeatedly read, written, erased, or a combination thereof. In this configuration the some of the bits in the non-volatile memory cells 202 will remain reliable but could be charge depleted moving the data closer to the threshold voltage ($V^{TH}$) and thereby susceptible to noise or other errors. There can be an increased number of the single bit errors, the occasional double bit error, and the rare triple bit error in the hard data bits 212. The syndrome bits 222 indicating the single bit errors, the occasional double bit error, and the rare triple bit error located in the cluster still allows very efficient compression of the soft information 218 having a range of 51 to 53 percent compression ratio. In the maintenance of the non-volatile memory system 100, the fifth compression characteristic 314 would likely indicate that the contents of the non-volatile memory cells 202 should be copied to a new location.

The transfer of the syndrome bits 222 will indicate the bit location of the suspected unreliable bits within the cluster 302 in order to facilitate correction of the unreliable bits. The syndrome bits 222 for each of the cluster 302 will be concatenated for transfer. It is understood that the increase in the size of the cluster 302 can increase the amount of the compression ration percent 304 due to the fewer number of the cluster 302 required to address all of the bits in the hard data bits 212. Since most of the bit locations in the non-volatile memory cells 202 remain reliable, the number of the syndrome bits 222 transferred remains low.

It has been discovered that transfer of the syndrome bits 222 from the lossless compression module 220 can correct the vast majority of the unsuccessful decode of the hard data bits 212 by the error correction module 118 of FIG. 1. Due to the monitoring and exchange of bad pages within the non-volatile memory cells 202, most of the data will be read with high reliability. As the non-volatile memory device 118 ages, an increased number of single and double bit errors can be detected. The correction of these errors can be performed by the non-volatile memory system 100 while still utilizing less time and less energy than would be required by other error correction mechanisms. The transfer of the syndrome bits 222, which contains interpretation of all of the soft information 218 can speed the LDPC iterative decode process and maintain the bandwidth capabilities of the non-volatile memory system 100.

A variable rate code for sharing the soft information 218 between the non-volatile memory device 118 and the error correction module 128 of FIG. 1 can improve the efficiency of the LDPC iterative decode process. To be efficient, bit patterns that repeats most frequently should be represented with the shortest codes for the syndrome bits 222, and uncommon bit sequences can be represented with longer codes for the syndrome bits 222 since they occur so infrequently. As an example, a lossless compression routine using the Huffman coding is demonstrated in Table 1.

TABLE 1

Sample Huffman coding as applied to the third compression characteristic 310.

| | | |
|---|---|---|
| N | | 4 |
| Prob of Unreliable Bit | | 0.04 |
| Prob of Reliable Bit | | 0.96 |

| # Unreliable Bits/CW | Prob of Occur | Syndrome bits | Syndrome Length | (Pr of occ) * Length |
|---|---|---|---|---|
| 0 | 8.49E−01 | 0 | 1 | 8.49E−01 |
| Bit 0 | 3.54E−02 | 101 | 3 | 1.06E−01 |
| Bit 1 | 3.54E−02 | 110 | 3 | 1.06E−01 |
| Bit 2 | 3.54E−02 | 111 | 3 | 1.06E−01 |
| Bit 3 | 3.54E−02 | 1000 | 4 | 1.42E−01 |
| Bits 0 and 1 | 1.47E−03 | 100111 | 6 | 8.85E−03 |
| Bits 0 and 2 | 1.47E−03 | 1001010 | 7 | 1.03E−02 |
| Bits 0 and 3 | 1.47E−03 | 1001011 | 7 | 1.03E−02 |
| Bits 1 and 2 | 1.47E−03 | 1001000 | 7 | 1.03E−02 |
| Bits 1 and 3 | 1.47E−03 | 1001001 | 7 | 1.03E−02 |
| Bits 2 and 3 | 1.47E−03 | 1001100 | 7 | 1.03E−02 |
| Bits 0, 1 and 2 | 6.14E−05 | 100110101 | 9 | 5.53E−04 |
| Bits 0, 1 and 3 | 6.14E−05 | 100110110 | 9 | 5.53E−04 |
| Bits 0, 2 and 3 | 6.14E−05 | 100110111 | 9 | 5.53E−04 |
| Bits 1, 2 and 3 | 6.14E−05 | 1001101000 | 10 | 6.14E−04 |
| All the bits | 2.56E−06 | 1001101001 | 10 | 2.56E−05 |
| | | Avg Soft bits/data bit | | 0.343 |

Assuming that the lossless compression module 220 of FIG. 2 is configured to operate on one nibble (4 bit) for each of the cluster 302 at a time (that is, N=4), there can be 16 possible scenarios for unreliable bits. These scenarios correspond to 1 case for no errors, 4 cases for single bit errors, 6 cases for double bit errors, 4 cases for triple bit errors, and finally 1 case where all the bits are in error. Assuming that the hard data bits 212 are independent of each other, the probabilities for each case can be computed based on the probability of a single unreliable bit. These probabilities along with the corresponding syndrome bits 222 for each case are tabulated in Table 1.

As seen from the Table 1, the unreliable bit sequences having the lowest probability of occurrence are encoded with longer versions of the syndrome bits 222. For instance, the lossless compression module 220 assigns a single "0" to the case where none of the bits are unreliable because this is the most frequent occurrence. On the other hand, the worst case scenario where all the four bits are erroneous is encoded with 10 bits. This is due to the fact that while the no error case occurs about 84% of the time, the worst case scenario happens less than 3 times per $10^5$ transfers. Therefore, it makes sense to transmit less soft information bits for cases that occur frequently. Without the lossless compression module 220, 1 soft information bit must be transferred per data bit to utilize all the information about erroneous bit locations. On the other hand, it can be seen that by using the lossless compression module 220, the same information can be transmitted using only 0.34 soft information bits per data bit. In the example, using the Huffman coding below, transmission of the syndrome bits 222 takes approximately $\frac{1}{3}^{rd}$ of the time required to send the soft information 218 uncompressed, and $\frac{1}{3}^{rd}$ of the total energy.

It is understood that the configuration of the lossless compression module 220 can be programmatically changed in order to alter the number of bits of the soft information 218 operated on for the generation of the syndrome bits 222. As demonstrated in FIG. 3, it can be advantageous to start at a higher size of the cluster 302 when the occurrence of single bit errors is rare in order to take advantage of the higher values of the compression ratio percentage 304. As the non-volatile memory storage system 100 of FIG. 1 ages, switching to a smaller size of the cluster 302 can provide a more detailed description of the suspected unreliable bits within the hard data bits 212.

By way of an example, with the size of the cluster 302 having a value of N=4, every $4^{th}$ bit of the soft information 218 can mark a boundary of the cluster 302 of the soft information 218. The syndrome bits 222 represented by every cluster 302 of the soft information 218.

TABLE 2

| a value of 1 in the soft information means the bit is suspect. | | | | | | | | | | | | | | | | |
|---|---|---|---|---|---|---|---|---|---|---|---|---|---|---|---|---|
| Hard Data Bits: | 1 | 0 | 1 | 1 | 0 | 0 | 0 | 1 | 0 | 1 | 1 | 1 | 0 | 0 | 1 | 0 |
| Soft Information | 0 | 0 | 0 | 0 | 1 | 0 | 0 | 1 | 0 | 0 | 0 | 1 | 1 | 1 | 0 | 0 |
| Syndrome Bits | 0 | | | | 1001011 | | | | 0 | | | | 100111 | | | |
| LLR (all soft info) | 15 | −15 | 15 | 15 | −3 | −15 | −15 | 3 | −15 | 15 | 15 | 15 | −3 | −3 | 15 | −15 |

The LLR values show the value of the probability bits 236 of FIG. 2 for all of the soft information 218. A value of 15 is a very confident 1 and a value of −15 is a very confident 0. The lower the absolute number of the probability the less confidence is conveyed. In the example above a LLR value of −3 represents a weak 0 and a LLR value of 3 represents a weak 1. The error correction module 128 can iteratively reverse the value of the low confidence bits during the LDPC iterative decode process in order to correct the hard data bits 212.

It is understood that the above example using the Huffman coding is used to demonstrate the operation of the non-volatile memory system 100 without limiting the invention. Any of the lossless compression algorithms can be implemented to optimize the throughput and power utilization of the non-volatile memory system 100. More efficient codes requiring more complex decoding and more complex encoding can be constructed. The compression ratio percent 304 of the syndrome bits 222 can generally be increased by an increase in the size, N, of the cluster 302.

It has been discovered that the lossless compression module 220 can provide the error correction module 128 with a high quality of the soft information 218 by transferring the minimum amount of the syndrome bits 222 needed to complete a successful decode of the hard data bits 212. Once a decode of the hard data bits 212 fails, all of the soft information 218 is transferred through the lossless compression module 220 and transferred as the syndrome bits 222 utilizing only $\frac{1}{3}^{rd}$ of the bandwidth and the power that would be needed to transfer all of the soft information 218. Since all of the detail of the soft information 218 is utilized by the error correction module 128 to perform the LDPC iterative decode, the correction can take less time and further reduce any bandwidth penalty caused by the errors in the hard data bits 212.

Figure 4:
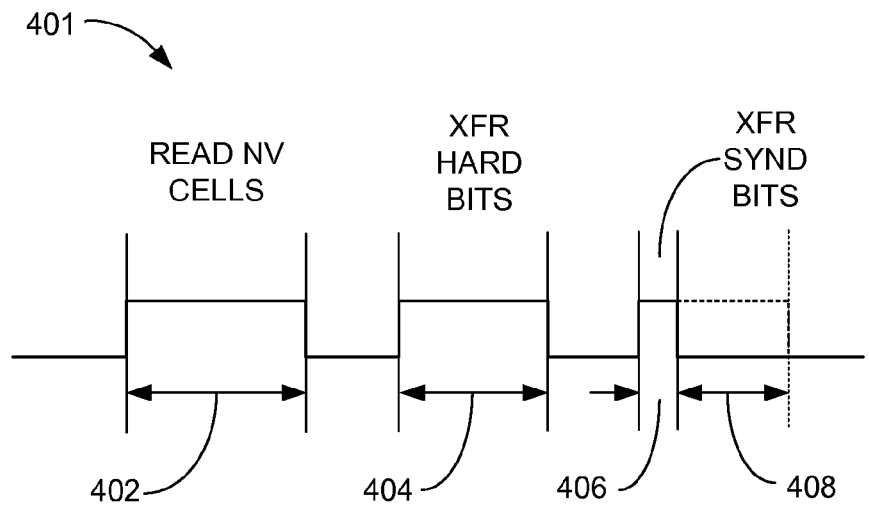
FIG. 4 is an exemplary timing diagram of the power used for data retrieval processes of the non-volatile memory system of FIG. 1.

Referring now to FIG. 4, therein is shown an exemplary timing diagram 401 of the power used for data retrieval processes of the non-volatile memory system 100 of FIG. 1. The exemplary timing diagram 401 depicts the power utilized by the non-volatile memory system 100 to retrieve the hard data bits 212 of FIG. 2 and perform the LDPC iterative decode process to correctly decode the host data 104 of FIG. 1. A read access 402, of the non-volatile memory cells 202 of FIG. 2, can take 40-60 microseconds for storing the contents of the non-volatile memory cells 202 in the first read register 208 of FIG. 2 and the second read register 210 of FIG. 2. During the read access 402 the reliability logic 214 of FIG. 2 can generate the soft information 218 of FIG. 2 and the syndrome bits 222 of FIG. 2. A data transfer 404 of the hard data bits 212 of FIG. 2, from the destination register 206 of FIG. 2 to the error correction module 128 of FIG. 1, can take 45 microseconds.

By utilizing the variable length of the syndrome bits 222, of the non-volatile memory system 100, a syndrome bits transfer 406 required for the LDPC iterative decode process can be between 6 and 15 micro-seconds. This can be favorably compared to the transfer of the total content of the soft information 218 which would take the same 45 microseconds of time and energy as the data transfer 404 of the hard bits 212. An energy saving duration 408 can be between 30 and 39 microseconds.

The efficiencies provided by the non-volatile memory system 100 can improve bandwidth and energy utilization while maintaining a robust error correction capability.

Figure 5:
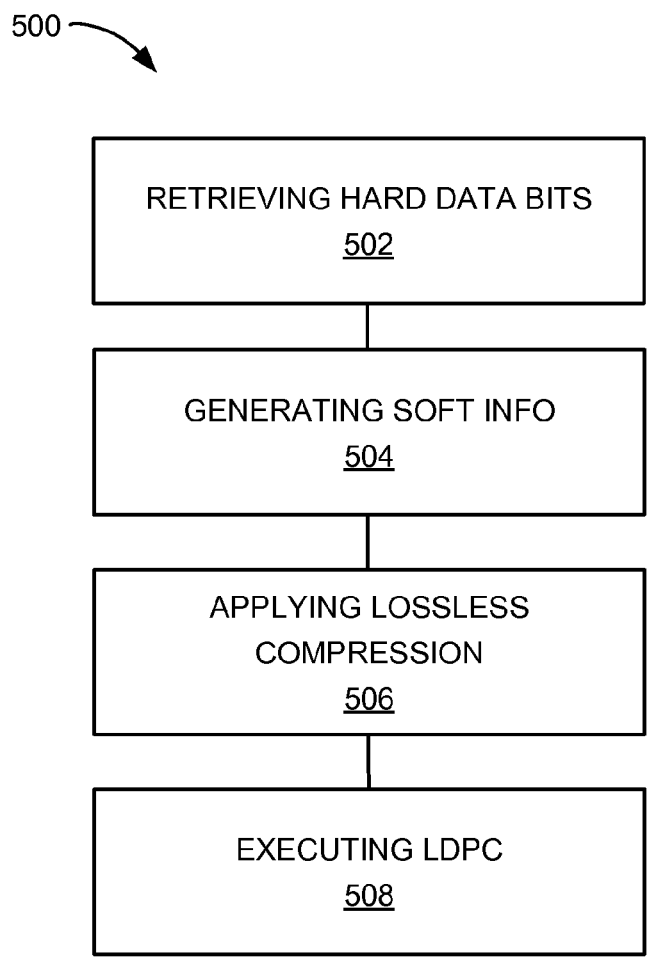
FIG. 5 is a flow chart of a method of operation of a non-volatile memory system in a further embodiment of the present invention.

Referring now to FIG. 5, therein is shown a flow chart of a method 500 of operation of a non-volatile memory system in a further embodiment of the present invention. The method 500 includes: retrieving hard data bits in a block 502; generating soft information from the hard data bits in a block 504; applying a lossless compression to the soft information for calculating syndrome bits in a block 506; and executing a low density parity check (LDPC) iterative decode on the hard data bits and the syndrome bits in a block 508.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A non-volatile memory system comprising:
    a non-volatile memory device having non-volatile memory;
    a destination register, coupled to the non-volatile memory, for retrieving hard data bits from the non-volatile memory;
    a soft information module, coupled to the destination register, for calculating soft information from the hard data bits;
    a lossless compression module, coupled to the soft information module, configured to calculate syndrome bits from the soft information;

a decompression module configured to decompress cluster syndrome bits from the syndrome bits;

a compute log likelihood ratio (LLR) module, coupled to the decompression module, configured to calculate probability values from the decompressed cluster syndrome bits; and an error correction module, coupled to the lossless compression module, for generating host data by executing a low density parity check (LDPC) iterative decode on the hard data bits and the syndrome bits;

wherein the decompression module, compute log likelihood ratio (LLR) module and error correction module are configured to receive soft information compressed into syndrome bits, decompress the received syndrome bits to generate cluster syndrome bits, and generate host data by executing a low density parity check (LPDC) iterative decode on the hard data bits and the probability values in response to a determination that decoding the hard data bits was unsuccessful.

2. The system of claim 1, wherein the lossless compression module, coupled to the soft information module, is further configured to examine a cluster of the soft information and select a variable length code for the cluster.

3. The system of claim 1, wherein the destination register, coupled to the non-volatile memory, includes a first read register and a second read register.

4. The system of claim 1, further comprising a reliability logic module, coupled to the destination register, configured to compare a first read register, for loading values of the hard data bits read using a first threshold voltage, and a second read register, for loading values of the hard data bits read using a second threshold voltage, for generating the soft information.

5. The system of claim 1, further comprising a multiplexer, coupled to both the destination register and the lossless compression module, configured to transfer hard data bits and syndrome bits across a single data bus.

6. The system of claim 5, further comprising a demultiplexer, coupled to both the decompression module and the error correction module, configured to direct hard data bits to the error correction module and to direct syndrome bits to the decompression module.

7. The system of claim 6, further comprising a selection controller, coupled to both the multiplexer and the demultiplexer, configured to select between hard data bits and syndrome bits.

8. A non-volatile memory system comprising:
a non-volatile memory device including:
a non-volatile memory device having non-volatile memory,
a destination register, coupled to the non-volatile memory, for retrieving hard data bits from the non-volatile memory;
a soft information module, coupled to the destination register, for calculating soft information from the hard data bits, and
a lossless compression module, coupled to the soft information module, for calculating syndrome bits from the soft information; and
a memory controller, coupled to the non-volatile memory device, including:
a decompression module for decompressing cluster syndrome bits from the syndrome bits;
a compute log likelihood ratio (LLR) module, coupled to the decompression module, for calculating probability values from the decompressed cluster syndrome bits; and an error correction module for generating a host data by executing a low density parity check (LDPC) iterative decode on the hard data bits and the syndrome bits;

wherein the decompression module, compute log likelihood ratio (LLR) module and error correction module are configured to receive soft information compressed into syndrome bits, decompress the received syndrome bits to generate cluster syndrome bits, and generate host data by executing a low density parity check (LPDC) iterative decode on the hard data bits and the probability values in response to a determination that decoding the hard data bits was unsuccessful.

9. The system of claim 8, wherein the destination register further includes a first read register and a second read register for generating soft information.

10. The system of claim 8, wherein:
the non-volatile memory device includes:
a reliability logic module, coupled to the destination register, for calculating a soft information, and
a multiplexer, coupled to the lossless compression module and the destination register, for transferring the hard data bits and the syndrome bits on a flash data bus; and
the controller module includes a demultiplexer coupled to the flash data bus for separating the hard data bits and the syndrome bits.

11. A method of operating a non-volatile memory system comprising:
at a memory controller coupled to a non-volatile memory device,
receiving hard data bits from non-volatile memory in the non-volatile memory device; and
in response to a determination that decoding the hard data bits was unsuccessful:
calculating soft information from the hard data bits;
calculating syndrome bits from the soft information;
decompressing the syndrome bits to generate cluster syndrome bits;
calculating probability values from the decompressed cluster syndrome bits; and
generating host data by executing a low density parity check (LDPC) iterative decode on the hard data bits and the probability values.

12. The method of claim 11, including examining a cluster of the soft information and selecting a variable length code for the cluster.

13. The method of claim 11, wherein calculating the soft information includes comparing values of the hard data bits read using a first threshold voltage with values of the hard data bits read using a second threshold voltage, for generating the soft information.

14. The method of claim 13, wherein the hard data is received by a destination register, including a first read register and a second read register, and the comparing compares values in the first read register with values in the second read register.

15. The method of claim 11, wherein the soft information is compressed into the syndrome bits by lossless compression.

16. The method of claim 11, wherein the hard data bits and syndrome bits are received through a demultiplexer in the memory controller.

17. The method of claim 16, further comprising, via the demultiplexer, sending the hard data bits to a decoder and sending the syndrome bits to a decompressor.

18. A method of operating a non-volatile memory system comprising:

at a non-volatile memory device, having non-volatile memory:
retrieving hard data bits from the non-volatile memory;
calculating soft information from the hard data bits, and using lossless compression, calculating syndrome bits from the soft information; and
at a memory controller, coupled to the non-volatile memory device:
decompressing the syndrome bits to generate cluster syndrome bits
calculating probability values from the decompressed cluster syndrome bits; and
generating a host data by executing a low density parity check (LDPC) iterative decode on the hard data bits and the probability values in response to a determination that decoding the hard data bits was unsuccessful.

19. The method of claim 18, including,
transferring the hard data bits and the syndrome bits from the non-volatile memory device to the memory controller via a flash data bus and a multiplexer; and
at the memory controller, demultiplexing information on the flash data bus to separate the hard data bits and the syndrome bits.

20. The method of claim 19, further comprising, via a demultiplexer, sending the hard data bits to a decoder and sending the syndrome bits to a decompressor.

* * * * *